(12) United States Patent
Iwata (10) Patent No.: US 8,371,317 B2
(45) Date of Patent: Feb. 12, 2013

(54) SURFACE TREATMENT APPARATUS

(75) Inventor: Yasumasa Iwata, Kawasaki (JP)

(73) Assignee: Tokyo Ohka Kogyo Co., Ltd, Kanagawa (JP)

( * ) Notice: Subject to any disclaimer, the term of this patent is extended or adjusted under 35 U.S.C. 154(b) by 805 days.

(21) Appl. No.: 12/230,299

(22) Filed: Aug. 27, 2008

(65) Prior Publication Data

US 2009/0056767 A1 Mar. 5, 2009

(30) Foreign Application Priority Data

Aug. 30, 2007 (JP) ................................. 2007-224052

(51) Int. Cl.
*B08B 3/08* (2006.01)
(52) U.S. Cl. ...................... 134/95.2; 134/94.1; 134/95.1; 134/902
(58) Field of Classification Search ................. 134/94.1, 134/95.1, 95.2, 105, 902; 118/50, 723 E, 118/728; 219/121.43, 390; 156/345.12, 156/345.33, 345.51, 345.55; 438/692
See application file for complete search history.

(56) References Cited

U.S. PATENT DOCUMENTS

| | | | | |
|---|---|---|---|---|
| 4,899,686 A | * | 2/1990 | Toshima et al. ................ | 118/50 |
| 5,273,588 A | * | 12/1993 | Foster et al. .............. | 118/723 E |
| 5,525,160 A | * | 6/1996 | Tanaka et al. ................. | 118/728 |
| 5,834,730 A | * | 11/1998 | Suzuki et al. ............ | 219/121.43 |
| 6,315,858 B1 | * | 11/2001 | Shinozuka et al. ....... | 156/345.33 |
| 6,333,268 B1 | * | 12/2001 | Starov et al. ................... | 438/691 |
| 6,423,642 B1 | * | 7/2002 | Peace et al. ................... | 438/694 |
| 6,437,290 B1 | * | 8/2002 | Shao et al. .................... | 219/390 |
| 6,488,040 B1 | | 12/2002 | de Larios et al. | |
| 6,632,335 B2 | * | 10/2003 | Kunisawa et al. ......... | 204/230.2 |
| 6,692,613 B2 | * | 2/2004 | Peace et al. .............. | 156/345.55 |
| 6,893,172 B2 | | 5/2005 | Nakamura et al. | |
| 7,191,787 B1 | | 3/2007 | Redeker et al. | |
| 7,297,190 B1 | | 11/2007 | Dordi et al. | |
| 7,367,345 B1 | | 5/2008 | Hemker et al. | |
| 7,584,761 B1 | | 9/2009 | Yun et al. | |
| 7,632,376 B1 | | 12/2009 | Ravkin et al. | |
| 7,806,126 B1 | | 10/2010 | Mikhaylichenko et al. | |
| 7,810,513 B1 | | 10/2010 | Boyd et al. | |

(Continued)

FOREIGN PATENT DOCUMENTS

| | | |
|---|---|---|
| JP | 09-120952 | 5/1997 |
| JP | 09-299889 | 11/1997 |

(Continued)

OTHER PUBLICATIONS

Japanese Office Action dated Nov. 15, 2011 for Application No. JP 2007-224052.

*Primary Examiner* — Michael Barr
*Assistant Examiner* — Benjamin L Osterhout
(74) *Attorney, Agent, or Firm* — Harness, Dickey & Pierce, P.L.C.

(57) ABSTRACT

A surface treating jig of the present invention includes a treatment solution collecting section having (i) a ring-like groove formed on a surface (a) facing to a surface (a) to be treated of a semiconductor wafer and (ii) a through hole for collecting the treatment solution, the through hole formed so as to be continuous with the ring-like groove. With this arrangement, the present invention provides a surface treatment apparatus that prevents the treatment solution from spattering to a surface other than the surface (a) to be treated, and thereby, treatment with the treatment solution can be performed only with respect to the target surface.

12 Claims, 4 Drawing Sheets

U.S. PATENT DOCUMENTS

| | | | |
|---|---|---|---|
| 2002/0134512 A1* | 9/2002 | Adachi et al. | 156/345.51 |
| 2003/0047881 A1* | 3/2003 | Worm et al. | 277/628 |
| 2003/0075204 A1 | 4/2003 | de Larios et al. | |
| 2003/0075274 A1* | 4/2003 | Halpin et al. | 156/345.51 |
| 2004/0060195 A1 | 4/2004 | Garcia et al. | |
| 2004/0060573 A1 | 4/2004 | Woods | |
| 2004/0060580 A1 | 4/2004 | Woods | |
| 2004/0060581 A1 | 4/2004 | Garcia et al. | |
| 2004/0069319 A1 | 4/2004 | Boyd et al. | |
| 2004/0069326 A1 | 4/2004 | Woods et al. | |
| 2004/0069329 A1 | 4/2004 | de Larios et al. | |
| 2004/0165883 A1 | 8/2004 | Nakamura et al. | |
| 2004/0178060 A1 | 9/2004 | Ravkin et al. | |
| 2004/0182422 A1 | 9/2004 | Boyd et al. | |
| 2005/0139318 A1 | 6/2005 | Woods et al. | |
| 2005/0145265 A1 | 7/2005 | Ravkin et al. | |
| 2005/0145267 A1 | 7/2005 | Korolik et al. | |
| 2005/0145268 A1 | 7/2005 | Woods | |
| 2005/0148197 A1 | 7/2005 | Woods et al. | |
| 2005/0155629 A1 | 7/2005 | Ravkin et al. | |
| 2005/0158473 A1 | 7/2005 | Raykin et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0284767 A1 | 12/2005 | Dordi et al. | |
| 2006/0005860 A1 | 1/2006 | Garcia | |
| 2006/0081270 A1 | 4/2006 | Woods et al. | |
| 2006/0088982 A1 | 4/2006 | Boyd et al. | |
| 2006/0124153 A1 | 6/2006 | Yun et al. | |
| 2006/0150435 A1 | 7/2006 | Garcia et al. | |
| 2006/0191560 A1 | 8/2006 | Ravkin et al. | |
| 2006/0207636 A1 | 9/2006 | Garcia et al. | |
| 2006/0254078 A1 | 11/2006 | O'Donnell | |
| 2006/0260932 A1 | 11/2006 | Ravkin et al. | |
| 2006/0269877 A1 | 11/2006 | Boyd et al. | |
| 2007/0011905 A1 | 1/2007 | Garcia et al. | |
| 2007/0023070 A1 | 2/2007 | Woods et al. | |
| 2007/0048447 A1 | 3/2007 | Lee et al. | |
| 2007/0107756 A1 | 5/2007 | Woods et al. | |
| 2007/0119477 A1 | 5/2007 | Redecker | |
| 2007/0125400 A1 | 6/2007 | Matsui | |
| 2007/0218653 A1 | 9/2007 | de Larios et al. | |
| 2007/0235409 A1 | 10/2007 | Woods et al. | |
| 2007/0240737 A1 | 10/2007 | Zhu et al. | |
| 2007/0261594 A1 | 11/2007 | Vaskelis et al. | |
| 2007/0264436 A1 | 11/2007 | Dordi et al. | |
| 2007/0292603 A1 | 12/2007 | Dordi et al. | |
| 2007/0292604 A1 | 12/2007 | Dordi et al. | |
| 2007/0292615 A1 | 12/2007 | Dordi | |
| 2008/0006307 A1 | 1/2008 | Woods et al. | |
| 2008/0057182 A1 | 3/2008 | Boyd et al. | |
| 2008/0057198 A1 | 3/2008 | Yoon et al. | |
| 2008/0057221 A1 | 3/2008 | Boyd et al. | |
| 2008/0146025 A1 | 6/2008 | Dordi et al. | |
| 2008/0169008 A1 | 7/2008 | Yun et al. | |
| 2008/0171292 A1 | 7/2008 | Hemker et al. | |
| 2008/0230097 A1 | 9/2008 | Ravkin et al. | |
| 2008/0260940 A1 | 10/2008 | Yoon et al. | |
| 2008/0260963 A1 | 10/2008 | Yoon et al. | |
| 2008/0260967 A1 | 10/2008 | Yoon et al. | |
| 2008/0266367 A1 | 10/2008 | Ravkin et al. | |
| 2009/0081810 A1* | 3/2009 | Hamada et al. | 438/5 |
| 2009/0095198 A1 | 4/2009 | Norkus et al. | |
| 2009/0151753 A1 | 6/2009 | Woods | |
| 2009/0176360 A1 | 7/2009 | Garcia | |
| 2009/0304914 A1 | 12/2009 | Nalla et al. | |
| 2009/0320749 A1 | 12/2009 | Yoon et al. | |
| 2009/0320884 A1 | 12/2009 | Korolik et al. | |
| 2010/0009535 A1 | 1/2010 | Dordi et al. | |
| 2010/0071730 A1 | 3/2010 | Ravkin et al. | |
| 2010/0108652 A1 | 5/2010 | Boyd et al. | |
| 2010/0170803 A1 | 7/2010 | Dordi et al. | |
| 2010/0239767 A1 | 9/2010 | Dordi et al. | |
| 2010/0313443 A1 | 12/2010 | Mikhaylichenko et al. | |
| 2010/0319726 A1 | 12/2010 | Boyd et al. | |
| 2011/0155563 A1 | 6/2011 | Ravkin et al. | |
| 2011/0265823 A1 | 11/2011 | Ravkin et al. | |

FOREIGN PATENT DOCUMENTS

| | | |
|---|---|---|
| JP | 2006-041504 | 2/2006 |
| JP | 2007-158161 | 6/2007 |
| WO | WO 2006038472 A1 * | 4/2006 |

* cited by examiner

FIG. 4 ic chips. In some cases, after the thinned semiconductor wafer with the supporting plate bonded thereto is attached to the dicing tape, the supporting plate is stripped off, and then, the adhesive substance remaining on the semiconductor wafer is removed.

SURFACE TREATMENT APPARATUS

This Nonprovisional application claims priority under U.S.C. §119(a) on Patent Application No. 224052/2007 filed in Japan on Aug. 30, 2007, the entire contents of which are hereby incorporated by reference.

FIELD OF THE INVENTION

The present invention relates to a surface treatment apparatus for treating, with a treatment solution, a surface of an object to be treated (hereinafter, this object is referred to as target object).

BACKGROUND OF THE INVENTION

Recently, IC cards and mobile telephones are required to be thinner, smaller, and lighter in weight. For the sake of satisfying this requirement, semiconductor chips to be incorporated into such devices also need to be thin semiconductor chips. Specifically, as the thickness (the film thickness) of a semiconductor wafer that is used as a base of a next-generation semiconductor chip, a thickness in a range of 25 μm to 50 μm is said to be necessary whereas the thickness of a semiconductor wafer that is used as a base of a conventional semiconductor chip is in a range of 125 μm to 150 μm.

Methods for obtaining such a thin semiconductor wafer include a method in which, in order to maintain the strength of a thinned semiconductor wafer, a supporting plate for supporting the thinned semiconductor wafer is attached thereto. In this method, first, a semiconductor wafer and a board such as the supporting plate are bonded to each other by (i) a tape having an adhesion layer on both sides or (ii) adhesive. Second, the semiconductor wafer supported by the supporting plate is grinded with a grinder etc. A thinned semiconductor wafer is thus made. Lastly, the supporting plate is stripped off from the thinned semiconductor wafer.

In stripping the supporting plate, an adhesive substance of adhesion layers of the tape or an adhesive substance of the adhesive, which tape or adhesive fixes the semiconductor wafer and the supporting plate to each other, would remain on the semiconductor wafer. Therefore, it is necessary to perform a treatment for removing the remaining adhesive substance from a surface of the semiconductor wafer that surface is in contact with the supporting plate, so as to clean the surface.

The removal of the remaining adhesive substance can be performed by a method such as (i) spin cleaning in which a cleaning solution is spread over the surface of the semiconductor wafer by spinning the semiconductor wafer, and (ii) immersion cleaning in which the semiconductor wafer is immersed as it is in the cleaning solution.

There is an example in which a mechanism similar to that of the spin cleaning is applied to a development apparatus. Japanese Unexamined Patent Publication 2004-274028 (Tokukai 2004-274028, Publication date: Sep. 30, 2004) discloses the development apparatus that applies a photoresist to a substrate, transfers a circuit pattern to the photoresist by use of a photolithographic technique, and supplies a developing solution with a surface on which a latent image pattern is formed, thereby developing the applied photoresist film. As a mechanism for supplying the developing solution onto the photoresist, the spin method is employed for the development apparatus.

SUMMARY OF THE INVENTION

In the case of the aforementioned method, in which the supporting plate and the semiconductor wafer are bonded to each other by the tape having an adhesive layer on both sides or by the adhesive, the thinned semiconductor wafer is generally held by a dicing frame by use of a dicing tape when the thinned semiconductor wafer is being diced into individual chips. In some cases, after the thinned semiconductor wafer with the supporting plate bonded thereto is attached to the dicing tape, the supporting plate is stripped off, and then, the adhesive substance remaining on the semiconductor wafer is removed.

In either case, generally, the surface area of the dicing tape is larger than that of the semiconductor wafer. Accordingly, the dicing tape has an exposed surface around the semiconductor wafer. By performing a cleaning treatment of spin cleaning, in which a cleaning solution (solvent) is dropped on the semiconductor wafer being spun, or by performing a cleaning treatment of immersion cleaning, in which the semiconductor wafer is immersed in the cleaning solution, the cleaning solution adheres even to the exposed surface of the dicing tape.

That is, even the exposed surface of the dicing tape, which exposed surface is situated around the semiconductor wafer, is unnecessarily treated although only the surface of the semiconductor wafer should be treated. Depending on the type of the cleaning solution to be used, moreover, there is concern that the dicing tape deteriorates. Accordingly, desired is the development of a treatment apparatus that can remove the adhesive substance remaining on the semiconductor wafer, while allowing protection of the dicing tape.

In view of the problems, a main object of the present invention is to provide a surface treatment apparatus that can treat, with a treatment solution, only a surface to be treated (hereinafter, this surface is referred to as target surface).

In order to attain the object, an aspect of the present invention is a surface treatment apparatus including: a table for placing a target object having a target surface; treatment solution supplying means having a supplying opening for supplying a treatment solution to the target object; a surface treating jig for treating the target surface with the treatment solution; and holding means for holding the surface treating jig so that the surface treating jig does not come into contact with the target surface, the surface treating jig comprising a treatment solution collecting section, the treatment solution collecting section having: a ring-like groove formed on a facing surface facing to the target surface; and a collecting opening for collecting the treatment solution, the collecting opening being continuous with the groove.

Additional objects, features, and strengths of the present invention will be made clear by the description below. Further, the advantages of the present invention will be evident from the following explanation in reference to the drawings.

BRIEF DESCRIPTION OF THE DRAWINGS

of FIG. 4 is a plan view of the surface treating jig when viewed from above the facing surface of the surface treating jig.

DESCRIPTION OF THE EMBODIMENTS

The following describes an embodiment of a surface treatment apparatus of the present embodiment. As one example of application of the surface treatment apparatus, the present embodiment describes a case where the surface treatment apparatus is used in the cleaning of surface of a semiconductor wafer. However, needless to say, the application of the surface treatment apparatus of the present invention is not limited to this as long as the surface treatment apparatus is used for treating, with a treatment solution, a target surface of a target object.

(Arrangement of Surface Treatment Apparatus)

Figure 2:
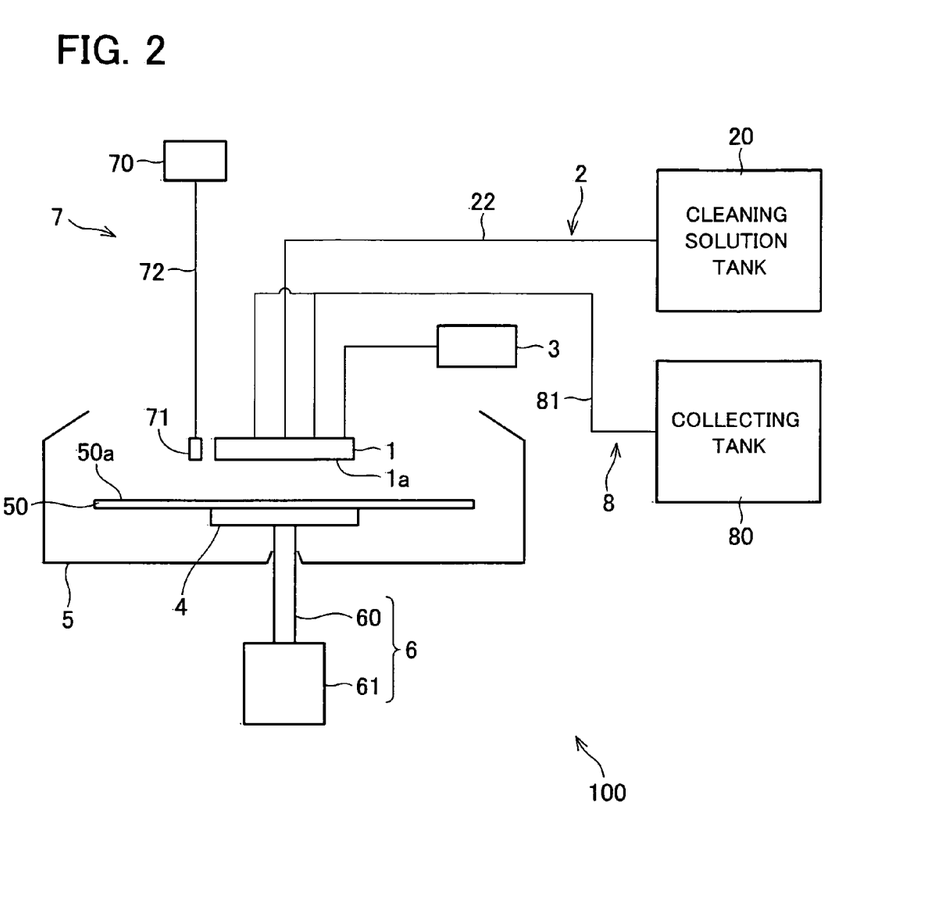
FIG. 2 is a cross-sectional view illustrating main parts of the surface treatment apparatus of the present invention.

The following describes an arrangement of the surface treatment apparatus with reference to FIG. 2. FIG. 2 is a schematic cross-sectional view illustrating main parts of a surface treatment apparatus 100.

As illustrated in FIG. 2, the surface treatment apparatus 100 generally includes a surface treating jig 1, a cleaning solution supplying section (treatment solution supplying means) 2, a space maintaining section (holding means) 3, a table 4, a cleaning cup 5, a spinning section 6, a drying section 7, and a cleaning solution collecting section (a treatment solution collecting section) 8. The below describes these members in detail.

Note that a semiconductor wafer (a target object) 50 is illustrated in FIG. 2 so that the surface treatment apparatus 100 of the present invention can be easily understood although the semiconductor wafer 50 is not a member of the surface treatment apparatus 100. Needless to say, an object that can be treated by the surface treatment apparatus 100 is not limited to the semiconductor wafer 50, but may be an object whose surface 50a to be treated (hereinafter, simply referred to as surface 50a) can be treated by the surface treating jig 1. Except for the semiconductor wafer 50, target objects encompass a CD (Compact Disc), a DVD (Digital Versatile Disc), a BD (Blu-ray Disc), and the like.

(Surface Treating Jig 1)

The surface treating jig 1 is a member for cleaning the surface 50a of the semiconductor wafer 50 with a cleaning solution (a treatment solution). A concrete arrangement of the surface treating jig 1 is described later in more detail.

(Cleaning Solution Supplying Section 2)

The cleaning solution supplying section 2 is a member for supplying, to the surface treating jig 1, the cleaning solution for treating the surface 50a.

As illustrated in FIG. 2, the cleaning solution supplying section 2 includes a cleaning solution tank 20 for storing the cleaning solution therein, a supplying pipe 22 for connecting the cleaning solution tank 20 and a supplying opening for supplying the cleaning solution to the surface 50a, and a pump (not illustrated) for supplying the cleaning solution to the surface treating jig 1.

(Space Maintaining Section 3)

The space maintaining section 3 maintains a space between the surface treating jig 1 and the surface 50a. With such a space maintained between the surface treating jig 1 and the surface 50a, the surface treating jig 1 can treat the semiconductor wafer 50 without causing flaws thereon. In addition, by maintaining a predetermined space when performing the treatment, the surface treating jig 1 can retain the cleaning solution in the space between a surface 1a facing to the surface 50a and the surface 50a (hereinafter, the surface 1a facing to the surface 50a is simply referred to as surface 1a).

The space maintaining section 3 may include a mechanism that allows the surface treating jig 1 to move parallel to the surface 50a and vertically to the surface 50a.

The space maintaining section 3 can be realized, specifically, as a member such as an arm for holding the surface treating jig 1.

(Table 4)

The table 4 is a member for holding the semiconductor wafer 50. For example, the table 4 may be provided with a suctioning mechanism for suctioning a back surface of the surface 50a. Thereby, the table 4 can tightly hold the semiconductor wafer 50, without causing flaws thereon.

(Cleaning Cup 5)

The cleaning cup 5 is a member for providing a treatment space in which the semiconductor wafer 50 is treated in the cleaning treatment. The cleaning cup 5 is provided so as to encompass the semiconductor wafer 50.

(Spinning Section 6)

The spinning section 6 is a member for spinning the table 4 about a normal passing through a substantial center of surface of the table 4. As described above, the semiconductor wafer 50 is held by the table 4. Accordingly, the spinning section 6 spins the semiconductor wafer 50 as well as the table 4. As illustrated in FIG. 2, the spinning section includes a spinning shaft 60 that spins about the substantial center and a motor 61 for spinning the spinning shaft 60. Note that, in the present description, "substantial center" includes a center and the periphery thereof.

(Drying Section 7)

The drying section 7 is a member for drying the semiconductor wafer 50 after the treatment. Concrete examples of the drying section 7 encompass means for supplying an inactive gas toward the surface 50a and means for suctioning a cleaning solution remaining on the surface 50a.

The drying section 7 may be integral with the surface treating jig 1, or alternatively, may be provided separately. In a case where an inactive gas is used for drying, kinds of the inactive gas are not especially limited, but may be a well-known inactive gas such as helium, nitrogen, and argon.

In a case where the drying section 7 is a means for drying with an inactive gas, the drying section 7 includes an inactive gas tank 70, a nozzle 71 for supplying the inactive gas, and an inactive gas supplying pipe 72 for connecting the inactive gas tank 70 and the nozzle 71. In a case where the drying section 7 is a means for drying by suctioning the cleaning solution, the drying section 7 includes a collection tank, a pump for suctioning the cleaning solution, and a collecting pipe for collecting the cleaning solution, although they are not illustrated in the figures.

The present embodiment describes a case where the surface treatment apparatus 100 includes the means for drying with an inactive gas. However, the surface treatment apparatus 100 is not limited to this case, but may include the means for drying by suctioning the cleaning solution, or alternatively, may include both means. The means for drying by suctioning the cleaning solution can be means for drying by suctioning the cleaning solution with the surface treating jig 1. This is described later in detail.

(Cleaning Solution Collecting Section 8)

The cleaning solution collecting section 8 is a member for collecting from the surface 50a a cleaning solution used to clean the surface 50a.

As illustrated in FIG. 2, the cleaning solution collecting section 8 includes a collecting tank 80 for collecting the cleaning solution used for the treatment, a collecting pipe 81 for connecting a collecting opening and the collecting tank 80, which are used to collect the cleaning solution, and a pump or an ejector (not illustrated) for suctioning the cleaning solution. The pump or the ejector may be provided subsequently to the collecting tank 80.

The collecting tank 80 is not necessarily required. Accordingly, the cleaning solution may be ejected from the surface treating jig 1 merely by a member such as the pump and the ejector. The cleaning solution collecting section 8 is described below in detail, together with the surface treating jig 1.

(Details of Arrangement of Surface Treating Jig 1)

Figure 1:
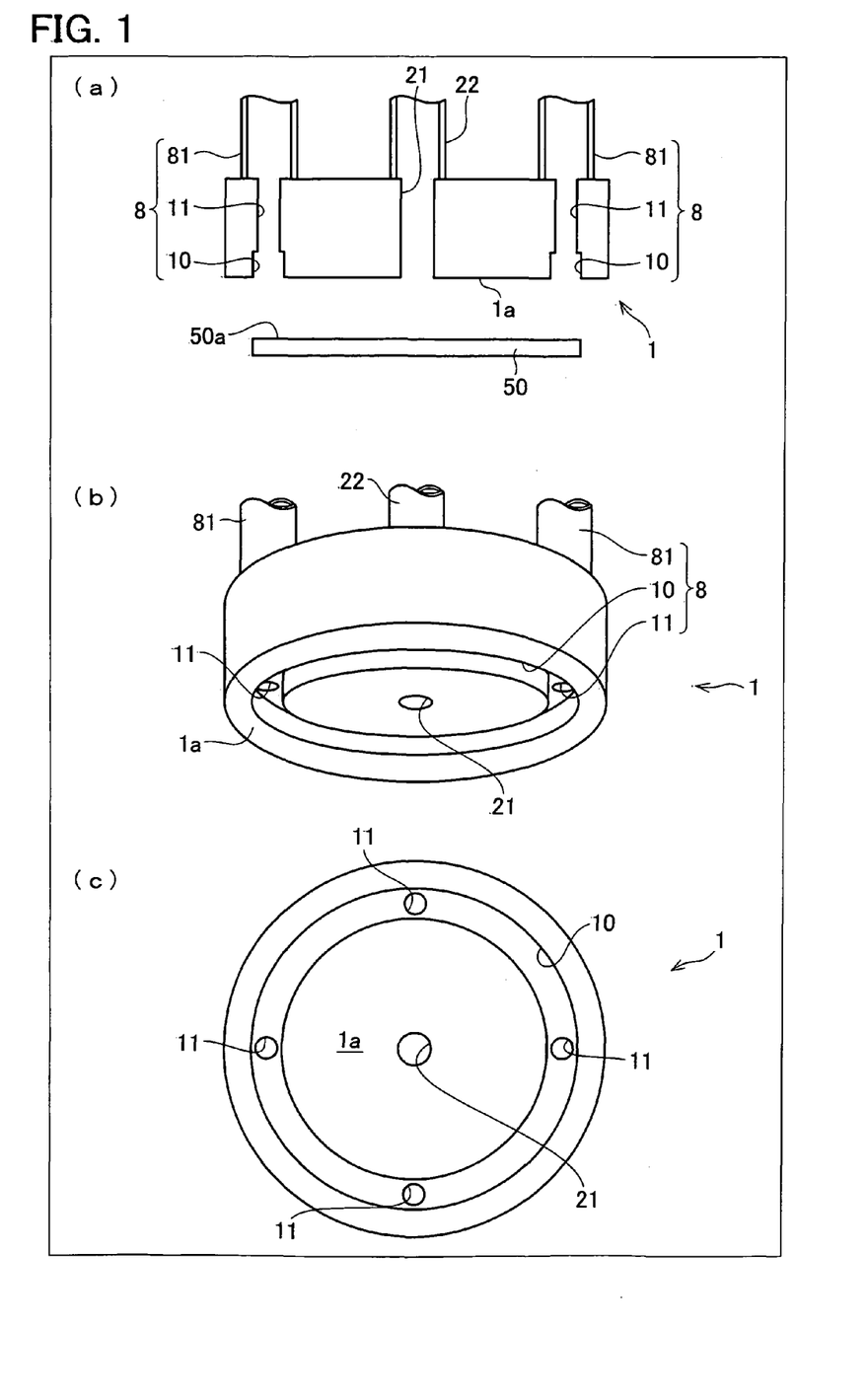
FIG. 1 is a view illustrating a surface treating jig provided in a surface treatment apparatus of the present invention. (a) of FIG. 1 is a cross-sectional view. (b) of FIG. 1 is a perspective view. (c) of FIG. 1 is a plan view of the surface treating jig when viewed from above a facing surface of the surface treating jig.

The following describes details of arrangement of the surface treatment apparatus 1, which includes main features of the present invention, with reference to (a) of FIG. 1 through (c) of FIG. 1. (a) of FIG. 1 through (c) of FIG. 1 are schematic views of the surface treating jig 1. (a) of FIG. 1 is a schematic cross-sectional view. (b) of FIG. 1 is a schematic perspective view. (c) of FIG. 1 is a schematic plan view illustrating the surface treating jig 1 when viewed from above the facing surface 1a. In (b) of FIG. 1 and (c) of FIG. 1, the semiconductor wafer 50 is not illustrated for the clear illustration of the surface 1a whereas, in (a) of FIG. 1, the semiconductor wafer 50 is illustrated for comparing sizes between the surface treating jig 1 and the semiconductor wafer 50.

As illustrated in (a) of FIG. 1 and (b) of FIG. 1, the surface treating jig 1 is integral with the cleaning solution collecting section 8. A groove 10 of the cleaning solution collecting section 8 is formed on the facing surface 1a of the surface treating jig 1. The groove 10 has a through hole (a collecting opening) 11 for collecting the cleaning solution from the surface 50a. The through hole 11 is provided so as to be continuous with the groove 10. In addition to the through hole 11, the surface treating jig 1 has another through hole (supplying opening) 21 for supplying the cleaning solution to the surface 50a.

(Shape of Groove 10)

As illustrated in (a) of FIG. 1 through (c) of FIG. 1, the groove 10 is formed in the vicinity of outer edge of the surface 1a. A cleaning solution supplied with the surface 50a is collected through the through hole 11, which is provided so as to be continuous with the groove 10. For the sake of allocating a space for the cleaning treatment as largely as possible with respect to the area of the surface 1a, the groove 10 is preferably formed as close as possible to the outer edge of the surface 1a. In the present description, "the vicinity of the outer edge" refers to an area range on the surface 1a that area range is 10 mm or less from the outer edge.

As illustrated in (b) of FIG. 1 and (c) of FIG. 1, in addition, the groove 10 is preferably formed in a ring-like shape to encompass the through hole 21 therein when viewed from above the top (or the bottom) of the surface treating jig 1. The shape of the groove 10 is not especially limited as long as the shape is a ring-like shape. For an efficient cleaning treatment, however, the shape of the groove 10 preferably corresponds to that of the semiconductor wafer 50. Note that, in the present description etc, "ring" and "ring-like" do not necessarily indicate a circle, but do indicate a loop (i.e., a shape without an end). Accordingly, in the present description etc., a circle is indicated by the term "circle."

A distance from an inner sidewall to an outer sidewall, which sidewalls constitute the groove 10, namely, a width of the groove 10, is preferably in a range of 0.5 mm to 3 mm. More preferably, the width is approximately 1 mm. A distance from the surface 1a to an opening section of the through hole 11 on the side of the surface 1a, namely, a depth of the groove 10, is preferably at least 0.5 mm, or deeper. More preferably, the depth is at least 1 mm, or deeper. The upper limit of depth of the groove 10 is preferably 10 mm or less.

Setting at least either one of the width or the depth of the groove 10 within the range above allows the groove 10 to temporarily retain therein the cleaning solution by a surface tension of the cleaning solution. This prevents the cleaning solution from otherwise spattering out of the surface treating jig 1. This makes it possible to collect through the through hole 11 the cleaning solution supplied through the through hole 21, while allowing no cleaning solution to spatter out of the surface treating jig 1.

As illustrated in (a) of FIG. 1, a size and shape of a region situated inside the inner sidewall of the groove 10 (hereinafter, the region is also referred to as inner region) preferably corresponds to those of the surface 50a, or are smaller than those of the surface 50a.

In a case where the size and the shape of the inner region are substantially the same as those of the surface 50a, or are smaller than those of the surface 50a, it is possible to prevent the cleaning solution supplied with the surface 50a from invading the backside of the surface 50a. This can prevent deterioration of the dicing tape caused by the cleaning solution that spatters out of the surface treating jig 1 and adheres to the exposed surface of the dicing tape.

Apart from the cleaning treatment of the semiconductor wafer 50, for example, smoothing treatment in which an acid is used as a treatment solution to smooth a target surface of the target object, can be benefited with this arrangement, which arrangement can prevent the treatment solution from reaching the backside of the target surface and thereby damaging a part other than the target surface of the target object.

Moreover, in a case where the size and the shape of the inner region substantially correspond to those of the surface 50a, namely, in a case where the inner region and the surface 50a are congruous with each other, the surface 50a can be treated without moving the surface treating jig 1 with respect to the semiconductor wafer 50. This makes it possible to treat the surface 50a, without failing to evenly treat the treated surface 50a. Furthermore, this reduces treating time.

In the present description etc., the term "substantially" covers "exactly" and allows a tolerance of ±10% from the "exact".

(Number and Shape of Through Hole 11 and Through Hole 21)

(b) of FIG. 1 and (c) of FIG. 1 illustrate a case where one through hole 21 and four through holes 11 are provided. However, the present invention is not limited to this. That is, it is possible to freely set the number of the through hole 11 and the through hole 21. For a full effect of the present invention, it is preferable to provide a plurality of through holes 11. For example, the number of the plurality of through holes 11 may be six or eight.

In addition, positions of the through hole 11 and the through hole 21 are not limited to (b) of FIG. 1 and (c) of FIG. 1. That is, the through holes 11 may be provided at equal intervals. Alternatively, the through holes 11 may be provided by forming a plurality of areas each having the plurality of through holes 11. The through hole 21 is preferably provided at the substantial center of the surface treating jig 1. The planer shape of each of the through hole 11 and the through hole 21 is not especially limited as long as the planer shape is a shape that does not hinder the flow of the cleaning solution, i.e., the shape such as a circle, an ellipse, or a rectangle.

In addition, it is possible to freely set diameters of the through hole 11 and the through hole 21. In order to show a clear boundary between the groove 10 and the through hole 11, (a) of FIG. 1 through (c) of FIG. 1 illustrate a case where the diameter of the through hole 11 is narrower than the width of the groove 10. However, the width of the groove 10 and the diameter of the through hole 11 may be the same.

(Method for Treating Semiconductor Wafer 50)

The following describes a method for treating the semiconductor wafer 50 with the surface treatment apparatus 100. In the method, first, the semiconductor wafer 50 is held on the table 4. As the table 4 includes a suctioning mechanism, the table 4 can tightly hold the semiconductor wafer 50, without causing flaws thereon. Then, the surface treating jig 1 is positioned above the semiconductor wafer 50 by use of the space maintaining section 3. In positioning the surface treating jig 1 as such, it is preferable that the surface 50a of the semiconductor wafer 50 and the surface 1a of the surface treating jig 1 are held so as not to come into contact with each other. Specifically, the distance between the surface 50a and the surface 1a is more preferably in a range of 0.5 mm to 2.0 mm, and further more preferably, the distance is approximately 1 mm. This makes it possible to retain the cleaning solution between the surface 50a and the surface la of the surface treating jig 1. At the same time, this makes it possible to properly collect the cleaning solution through the through hole 11.

Then, the cleaning solution supplying section 2 supplies the cleaning solution with the surface 50a (hereinafter, also referred to as supplying process). The cleaning solution is supplied through the through hole 21 provided on the surface treating jig 1. Whereas the cleaning solution is supplied, the supplied cleaning solution is collected by the cleaning solution collecting section 8 (hereinafter, also referred to as collecting process). Specifically, the collecting process of the cleaning solution supplied to the surface 50a is performed by suctioning the cleaning solution toward the collecting pipe 81 through the through hole 11 being continuous with the groove 10 on the surface 1a. In the collecting process, the cleaning solution used for the treatment of the surface 50a is temporarily retained in the groove 10 by the surface tension of the cleaning solution. Then, the cleaning solution is collected through the through hole 11, which is continuous with the groove 10, and the collecting pipe 81.

The supply amount of the cleaning solution in the supplying process is adjusted to an amount that the cleaning solution does not spatter out of the surface treating jig 1, namely, an amount that is almost the same as an amount to be collected. For example, a preferred supply amount for an 8-inch semiconductor wafer 50 is approximately 50 ml/min.

In a case where the size and the shape of the inner region are smaller than those of the surface 50a, the supplying process and the collecting process require moving the surface treating jig 1 with respect to the semiconductor wafer 50. In this case, the surface treating jig 1 is preferably moved from the substantial center of the semiconductor wafer 50 to the outer edge thereof. The surface 50a can be entirely treated by thus moving the surface treating jig 1 even if the inner region is smaller than the surface 50a. The surface 50a here does not preferably tilt with respect to the surface 1a. In other words, the surface 1a and the surface 50a are preferably parallel to each other. By keeping the surface 1a and the surface 50a parallel to each other, the cleaning solution supplied with the surface 50a can be uniformly spread over the surface 50a and almost the same amount as the supplied cleaning solution can be collected through each of the through holes 11. In a case where the size and the shape of the inner region are the same as those of the surface 50a, the surface treating jig 1 does not have to be moved.

In the supplying process and the collecting process, moreover, the cleaning solution may be supplied and collected, with the semiconductor wafer 50 spun about the normal passing through the substantial center of surface of the semiconductor wafer 50. In this case, spin speed is preferably 50 rpm or less. More preferably, the spin speed is approximately 30 rpm. At a spin speed of 50 rpm or less, especially, at a spin speed of approximately 30 rpm, the cleaning solution will not spatter out of the surface treating jig 1 and the used cleaning solution can be taken in the groove 10 without difficulty. That is, this makes it possible to prevent the cleaning solution from spattering out of an area to be treated. By spinning the semiconductor wafer 50, in addition, the cleaning solution can be spread over the surface 50a uniformly and rapidly. As a result, the treatment can be performed efficiently.

After the collecting process of the cleaning solution is completed, the surface 50a is dried (hereinafter, also referred to as drying process). The drying process can be performed with the drying section 7 by the aforementioned method for supplying an inactive gas or the aforementioned method for suctioning the cleaning solution. As described above, the drying process can be performed also with the surface treating jig 1. In a case where the surface treating jig 1 is used for drying, a cleaning solution remaining on the surface 50a is suctioned with the cleaning solution collecting section 8 while the cleaning solution supplying section 2 does not supply the cleaning solution. In this case, the surface treating jig 1 can perform both of the treatment by the cleaning solution and the drying. As a result, the surface treatment apparatus 100 can be efficiently used.

The cleaning treatment with the cleaning solution can be thus performed with respect to the surface 50a by use of the surface treatment apparatus 100 of the present invention.

(Functions/Effects)

As described above, the ring-like groove 10, which is formed on the surface 1a of the surface treating jig 1 of the surface treatment apparatus 100, temporarily retains the cleaning solution used to clean the surface 50a. That is, by the surface tension of the cleaning solution, the groove 10 temporarily retains therein the cleaning solution that otherwise will spatter out of the surface treating jig 1. As the through hole 11 for collecting the cleaning solution is provided so as to be continuous with the groove 10, the cleaning solution retained in the groove 10 is collected readily through the through hole 11 and the collecting pipe 81.

With this arrangement, the surface treatment apparatus 100 can prevent the cleaning solution from spattering out of the surface treating jig 1, thereby treating only the surface 50a, which should be treated in the cleaning treatment. That is, this makes it possible to prevent deterioration of the dicing tape caused by the adhesion of the cleaning solution to the exposed surface of the dicing tape. As a result, the surface treatment apparatus 100 can remove an adhesive substance on the semiconductor wafer 50, while protecting the dicing tape.

(Modification 1)

Figure 3:
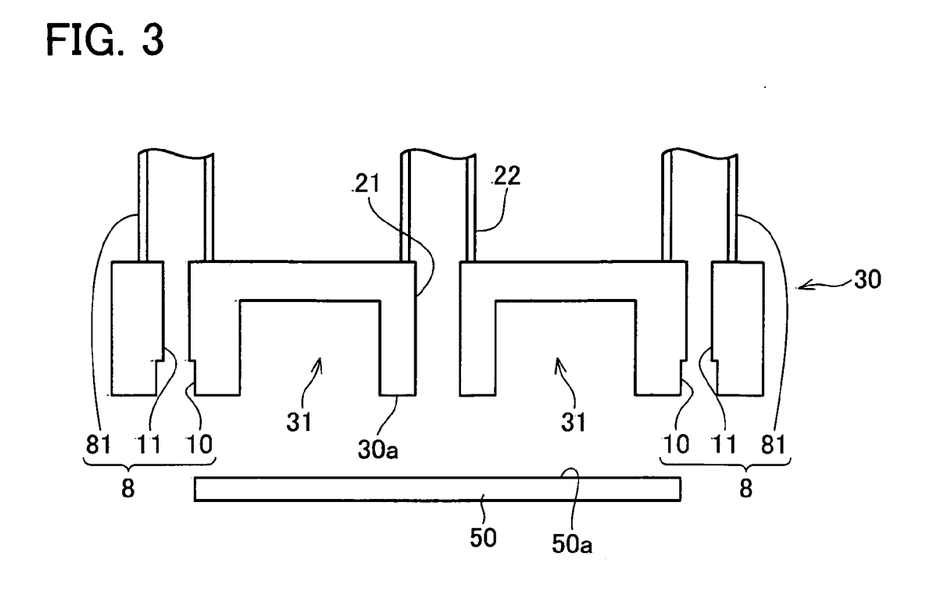
FIG. 3 is a cross-sectional view illustrating a modification of the surface treating jig.

The following describes a modification of the surface treating jig provided in the surface treatment apparatus of the present invention, with reference to FIG. 3. FIG. 3 is a schematic cross-sectional view illustrating a surface treating jig 30.

As illustrated in FIG. 3, in the surface treating jig 30, a surface 30a facing to a surface 50a to be treated (hereinafter, the surface 30a facing to the surface 50a to be treated is referred to as surface 30a and the surface 50a to be treated is referred to as surface 50a) has a recess section 31 in a region between a through hole 21 and a through hole 11. The provision of the recess section 31 prevents air bubbles contained in the cleaning solution from staying between the surface 30a and the surface 50a.

Accordingly, this can prevent a disadvantage that the air bubbles hinder the cleaning solution supplied through the through hole 21 from flowing towards the outer edge of the surface 30a and thereby the cleaning solution of a too much amount to be collected by a cleaning solution collecting section 8 surges into a part of the surface 30a. Therefore, the cleaning solution spreads entirely over the surface 30a. This can prevent the cleaning solution for spattering out of the surface treating jig 30.

(Modification 2)

Figure 4:
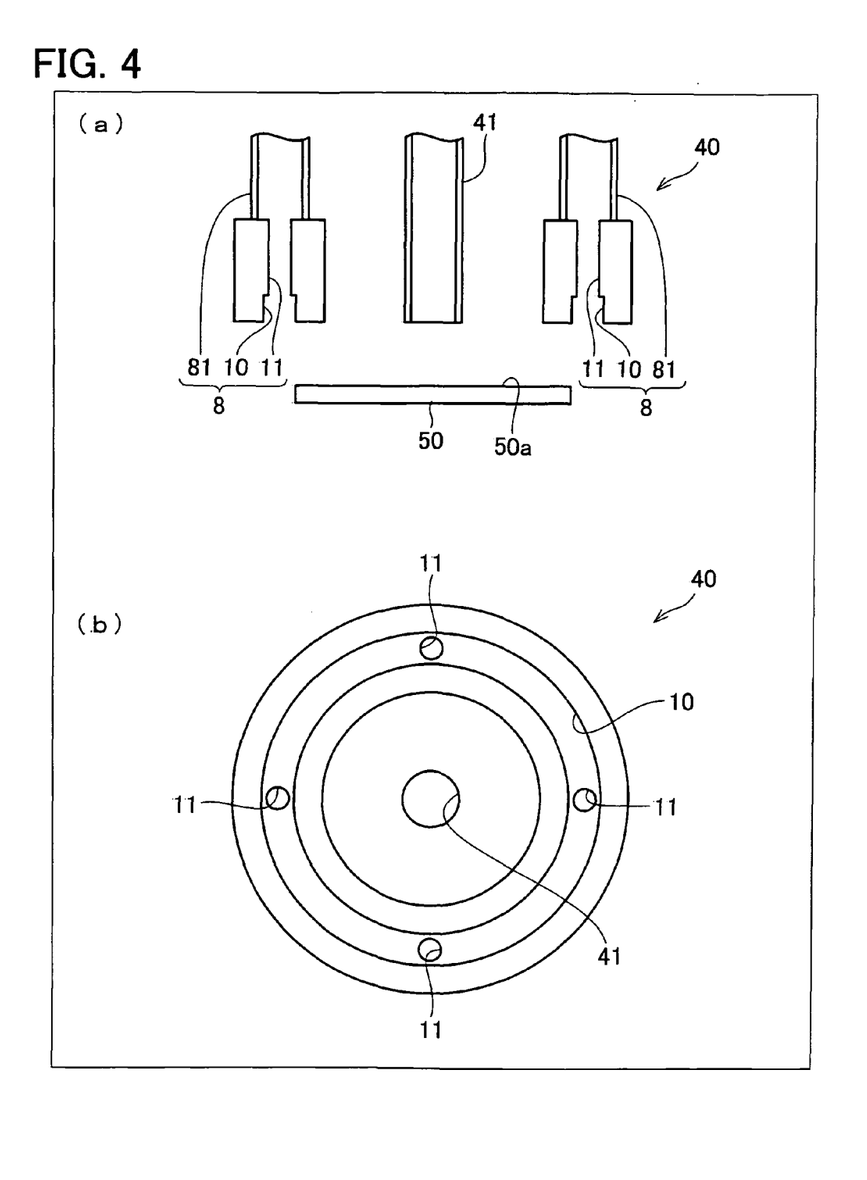
FIG. 4 is a view illustrating another modification of the surface treating jig. (a) of FIG. 4 is a cross-sectional view. (b)

The following describes another modification of the surface treating jig provided in the surface treatment apparatus of the present invention, with reference to (a) of FIG. 4 and (b) of FIG. 4. (a) of FIG. 4 and (b) of FIG. 4 are schematic views of a surface treating jig 40. (a) of FIG. 4 is a schematic cross-sectional view. (b) of FIG. 4 is a schematic plan view of the surface treating jig 40 when viewed from above a surface 40a of the surface treating jig 40 facing to a semiconductor wafer 50 (hereinafter, the surface 40a facing to the semiconductor wafer 50 is referred to as surface 40a).

As illustrated in (a) of FIG. 4 and (b) of FIG. 4, the surface treating jig 40 and a cleaning solution supplying section 2 are controlled separately from each other. That is, the through hole 21 (see FIG. 1) for supplying the cleaning solution is not provided in the surface treating jig 40. Accordingly, the cleaning solution is supplied through a supplying nozzle 41. (a) of FIG. 4 and (b) of FIG. 4 show a case where the surface treating jig 40 has a shape of a circle. However, the shape of the surface treating jig 40 is not limited to this, but may be an ellipse, a rectangle, or any other shapes. For an efficient treatment, it is preferable that the shape of a surface 50a to be treated of the semiconductor wafer 50 corresponds to that of the surface 40a of the surface treating jig 40.

In the modification 2, a space between the supplying nozzle 41 and the surface treating jig 40 produces the same effect as that produced by the recess section 31 described in the modification 1.

That is, the space makes it possible to prevent a disadvantage that the air bubbles hinder the cleaning solution supplied through the supplying nozzle 41 from flowing towards the outer edge of the surface 40a and thereby the cleaning solution of a too much amount to be collected by a cleaning solution collecting section 8 surges into a part of the surface 40a. Therefore, the cleaning solution spreads entirely over the surface 40a. This can prevent the cleaning solution for spattering out of the surface treating jig 40.

A surface treating jig provided in a surface treatment apparatus of the present invention includes: a ring-like groove formed on a facing surface facing to the target surface; and a treatment solution collecting section having a collecting opening for collecting the treatment solution, the collecting opening being continuous with the groove.

According to the arrangement, in the vicinity of the groove, the treatment solution supplied with the target surface is temporarily retained, by the surface tension of the treatment solution, in the groove that is formed on the surface of the surface treating jig facing to the target surface. The collecting opening for collecting the treatment solution is provided so as to be continuous with the groove. Accordingly, the treatment solution temporarily retained in the groove is collected readily through the collecting opening.

As a result, the treatment solution used for treating the target surface is collected so that the treatment solution does not spatter out of the surface treating jig. Therefore, the surface treatment apparatus of the present invention allows a treatment solution to be applied only to an area to be treated of a target object.

Moreover, in a case where the surface treatment apparatus of the present invention is used, for example, as a cleaning apparatus for removing an adhesive substance that remains on a semiconductor wafer bonded to a dicing frame via a dicing tape sandwiched therebetween, it is possible to prevent deterioration of the dicing tape caused by a cleaning solution (a treatment solution) for the removal of the adhesive substance that cleaning solution adheres to an exposed surface of the dicing tape. That is, the surface treatment apparatus of the present invention makes it possible that the adhesive substance remaining on the semiconductor wafer can be removed, while the dicing tape is protected.

The surface treatment apparatus of the present invention is applicable to a treatment apparatus for various kinds of treatment such as cleaning with a treatment solution and application of a treatment solution. The surface treatment apparatus of the present invention is suitably applicable especially to a cleaning apparatus for the removal of an adhesive substance that remains on the surface of a semiconductor wafer when stripping off a supporting plate from the semiconductor wafer.

The present invention is not limited to the description of the embodiments above, but may be altered by a skilled person within the scope of the claims. An embodiment based on a proper combination of technical means disclosed in different embodiments is encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A surface treatment apparatus comprising:
    a table for placing a target object having a target surface;
    a treatment solution supplying means having a supplying opening for supplying a treatment solution to the target object;
    a surface treating jig for treating the target surface with the treatment solution; and
    a holding means for holding the surface treating jig so that the surface treating jig does not come into contact with the target surface,
    the surface treating jig comprising a treatment solution collecting section,
    the treatment solution collecting section having:
    a ring-like groove formed on a facing surface facing to the target surface in the vicinity of an outer edge of the facing surface; and a collecting opening for collecting the treatment solution by suctioning the treatment solution from the target surface, the collecting opening being continuously communicated with a bottom of the groove.

2. The surface treatment apparatus as set forth in claim 1, wherein the treatment solution supplying means and the surface treating jig are integral with each other.

3. The surface treatment apparatus as set forth in claim 2, wherein the facing surface has a recess section in a region between the supplying opening and the collecting opening.

4. The surface treatment apparatus as set forth in claim 1, wherein the treatment solution supplying means and the surface treating jig are controlled separately from each other.

5. The surface treatment apparatus as set forth in claim 1, wherein a size and shape of a region inside an inner sidewall of the groove correspond to a size and shape of the target surface.

6. The surface treatment apparatus as set forth in claim 1, wherein the groove has a width in a range of 0.5 mm to 3 mm.

7. The surface treatment apparatus as set forth in claim 1, wherein the groove has a depth of at least 0.5 mm or deeper.

8. The surface treatment apparatus as set forth in claim 1, wherein more than one said collecting openings are provided.

9. The surface treatment apparatus as set forth in claim 1, further comprising spinning means for spinning the target object on the table.

10. The surface treatment apparatus as set forth in claim 1, further comprising drying means for drying the target object thus treated.

11. The surface treatment apparatus as set forth in claim 10, wherein the drying means includes inactive gas supplying means for supplying an inactive gas to at least the target surface.

12. The surface treatment apparatus as set forth in claim 10, wherein the drying means includes suctioning means for suctioning a treatment solution remaining at least on the target surface.

\* \* \* \* \*